US012560921B2

(12) United States Patent
Norman

(10) Patent No.: US 12,560,921 B2
(45) Date of Patent: Feb. 24, 2026

(54) MACHINE LEARNING PLATFORM FOR SUBSTRATE PROCESSING

(71) Applicant: Applied Materials, Inc., Santa Clara, CA (US)

(72) Inventor: David Everton Norman, Bountiful, UT (US)

(73) Assignee: Applied Materials, Inc., Santa Clara, CA (US)

( * ) Notice: Subject to any disclaimer, the term of this patent is extended or adjusted under 35 U.S.C. 154(b) by 939 days.

(21) Appl. No.: 17/483,264

(22) Filed: Sep. 23, 2021

(65) Prior Publication Data

US 2023/0089092 A1     Mar. 23, 2023

(51) Int. Cl.
*G05B 19/418* (2006.01)
*G06F 30/20* (2020.01)
*G06N 20/00* (2019.01)
*H01L 21/67* (2006.01)

(52) U.S. Cl.
CPC ....... *G05B 19/41885* (2013.01); *G06F 30/20* (2020.01); *G06N 20/00* (2019.01); *H01L 21/67276* (2013.01); *G05B 2219/23005* (2013.01); *G05B 2219/23288* (2013.01); *G05B 2219/2602* (2013.01)

(58) Field of Classification Search
None
See application file for complete search history.

(56) References Cited

U.S. PATENT DOCUMENTS

| | | | | |
|---|---|---|---|---|
| 9,671,779 | B2 * | 6/2017 | Norman | G05B 19/41865 |
| 10,296,376 | B2 * | 5/2019 | Norman | G06F 9/4881 |
| 10,884,342 | B2 * | 1/2021 | Maassen | G03F 7/705 |
| 11,796,978 | B2 * | 10/2023 | Chen | G05B 19/41885 |
| 12,222,707 | B2 * | 2/2025 | Liu | G06N 20/00 |
| 2008/0208372 | A1 | 8/2008 | Pannese | |

(Continued)

FOREIGN PATENT DOCUMENTS

| | | |
|---|---|---|
| KR | 10-20180090385 A | 8/2018 |
| WO | 2020205339 A1 | 10/2020 |

OTHER PUBLICATIONS

International Search Report and Written Opinion dated Jan. 12, 2023 for PCT Application No. PCT/US2022/044280.

(Continued)

*Primary Examiner* — Ryan F Pitaro
*Assistant Examiner* — Joseph P Morris
(74) *Attorney, Agent, or Firm* — Lowenstein Sandler LLP

(57) ABSTRACT

A method includes identifying at least one of historical data associated with historical substrate lots processed by substrate processing tools in a substrate processing facility or simulated data for simulated substrate lots processed by simulated substrate processing tools. The method further includes generating features from the at least one of the historical data for the historical substrate lots or the simulated data for the simulated substrate lots. The method further includes training a machine learning model with data input comprising the features to generate a trained machine learning model. The trained machine learning model is capable of generating one or more outputs indicative of one or more corrective actions to be performed in the substrate processing facility.

20 Claims, 7 Drawing Sheets

(56) References Cited

U.S. PATENT DOCUMENTS

| 2009/0119077 | A1* | 5/2009 | Norman ................. G05B 17/02 |
| | | | 703/6 |
| 2017/0109646 | A1 | 4/2017 | David |
| 2019/0086906 | A1* | 3/2019 | Emani .............. G05B 19/41885 |
| 2021/0232745 | A1 | 7/2021 | Chou et al. |
| 2022/0171373 | A1* | 6/2022 | Chau ................ G05B 19/41885 |
| 2023/0315953 | A1* | 10/2023 | Yedidsion ............... G06F 30/27 |
| | | | 703/6 |

OTHER PUBLICATIONS

Extended European Search Report for European Application No. 22873538.7 mailed Jul. 14, 2025, 09 Pages.

* cited by examiner

Figure 5C:
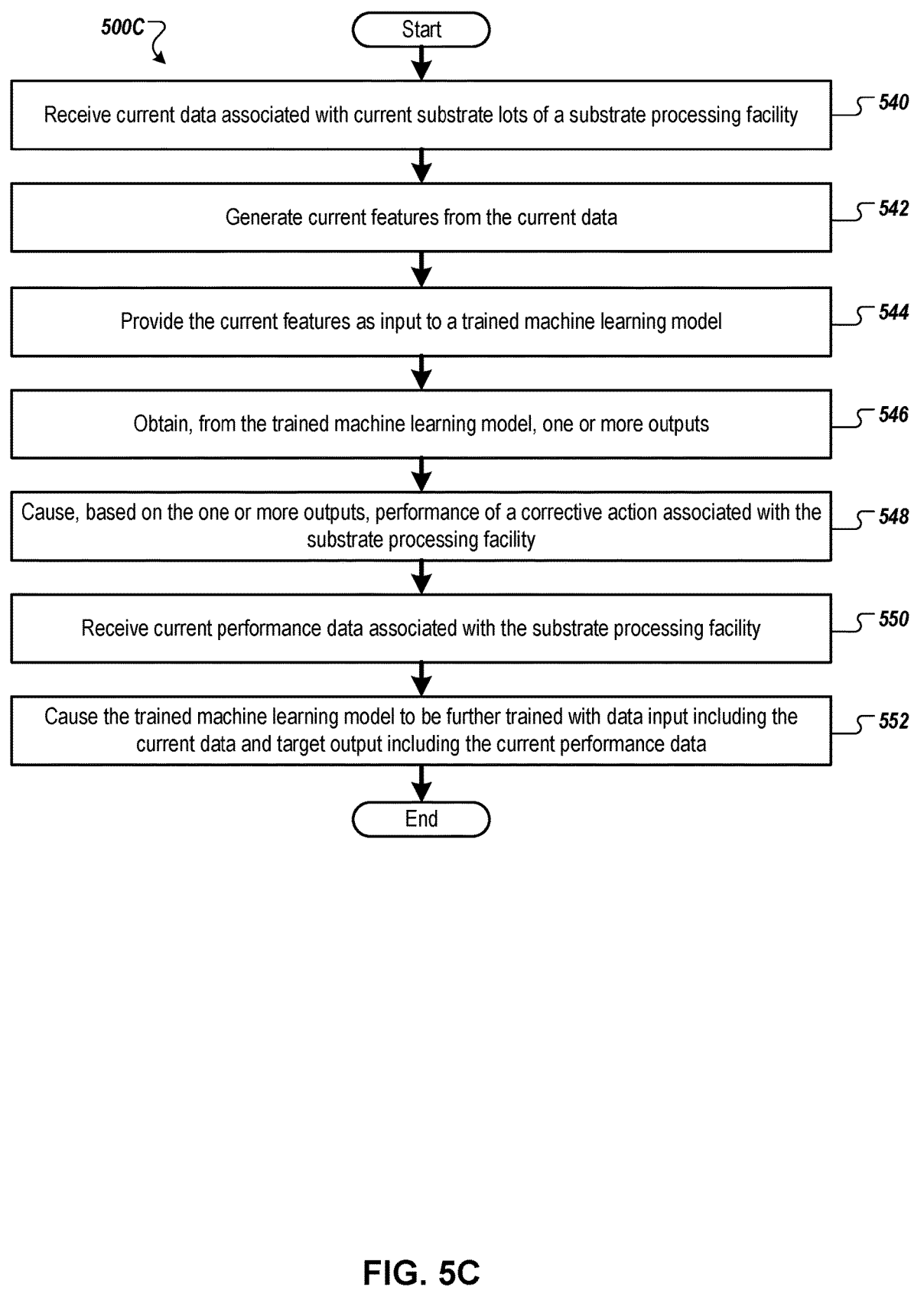

*500C*

( Start )

Receive current data associated with current substrate lots of a substrate processing facility — 540

Generate current features from the current data — 542

Provide the current features as input to a trained machine learning model — 544

Obtain, from the trained machine learning model, one or more outputs — 546

Cause, based on the one or more outputs, performance of a corrective action associated with the substrate processing facility — 548

Receive current performance data associated with the substrate processing facility — 550

Cause the trained machine learning model to be further trained with data input including the current data and target output including the current performance data — 552

( End )

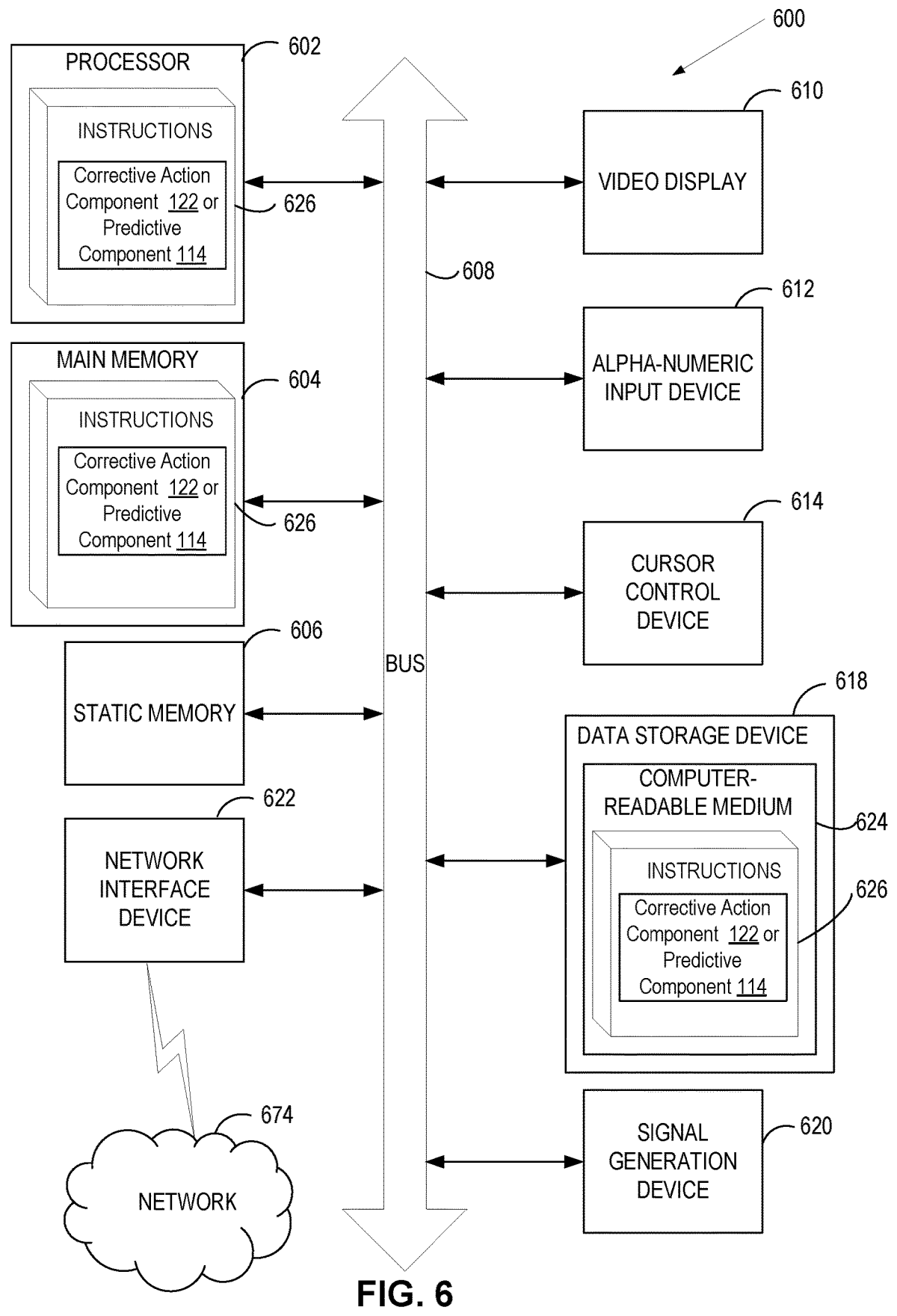

PROCESSOR — 602

INSTRUCTIONS

Corrective Action Component 122 or Predictive Component 114 — 626

MAIN MEMORY — 604

INSTRUCTIONS

Corrective Action Component 122 or Predictive Component 114 — 626

STATIC MEMORY — 606

NETWORK INTERFACE DEVICE — 622

NETWORK — 674

BUS — 608

VIDEO DISPLAY — 610

ALPHA-NUMERIC INPUT DEVICE — 612

CURSOR CONTROL DEVICE — 614

DATA STORAGE DEVICE — 618

COMPUTER-READABLE MEDIUM — 624

INSTRUCTIONS — 626

Corrective Action Component 122 or Predictive Component 114

SIGNAL GENERATION DEVICE — 620

FIG. 6

MACHINE LEARNING PLATFORM FOR SUBSTRATE PROCESSING

TECHNICAL FIELD

The present disclosure relates to platforms, and, more particularly, machine learning platforms for substrate processing.

BACKGROUND

Manufacturing facilities, such as substrate processing facilities, are used to produce products. Different manufacturing equipment can be scheduled to process different products. Manufacturing equipment may periodically not be available to process products due to preventative maintenance, component replacement, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method is of operating a substrate processing facility. The method includes method includes identifying at least one of historical data associated with historical substrate lots processed by substrate processing tools in a substrate processing facility or simulated substrate lots processed by simulated substrate processing tools. The method further includes generating features from the at least one of the historical data for the historical substrate lots or the simulated data for the simulated substrate lots. The method further includes training a machine learning model with data input including the features to generate a trained machine learning model. The trained machine learning model is capable of generating one or more outputs indicative of one or more corrective actions to be performed in the substrate processing facility.

In another aspect of the disclosure, a method is of operating a substrate processing facility. The method includes identifying current data associated with current substrate lots of the substrate processing facility. The method further includes identifying current features associated with the current data. The method further includes providing the current features to a trained machine learning model that was trained based on historical features, the historical features being generated based on at least one of historical data for historical substrate lots or simulated data for simulated substrate lots. The method further includes obtaining, from the trained machine learning model, one or more outputs. The method further includes causing, based on the one or more outputs, performance of one or more corrective actions associated with the substrate processing facility.

In another aspect of the disclosure, a non-transitory machine-readable storage medium storing instructions which, when executed cause a processing device to perform operations including identifying at least one of historical data associated with historical substrate lots processed by substrate processing tools in a substrate processing facility or simulated data for simulated substrate lots processed by simulated substrate processing tools. The operations further include generating features from the at least one of the historical data for the historical substrate lots or the simulated data for the simulated substrate lots. The operations further include training a machine learning model with data input including the features to generate a trained machine learning model. The trained machine learning model is capable of generating one or more outputs indicative of one or more corrective actions to be performed in the substrate processing facility.

BRIEF DESCRIPTION OF THE DRAWINGS

The present disclosure is illustrated by way of example, and not by way of limitation in the figures of the accompanying drawings.

FIGS. 5A-C are flow diagrams of methods associated with determining predictive data, according to certain embodiments.

FIG. 6 is a block diagram illustrating a computer system, according to certain embodiments.

DETAILED DESCRIPTION

Figure 1:
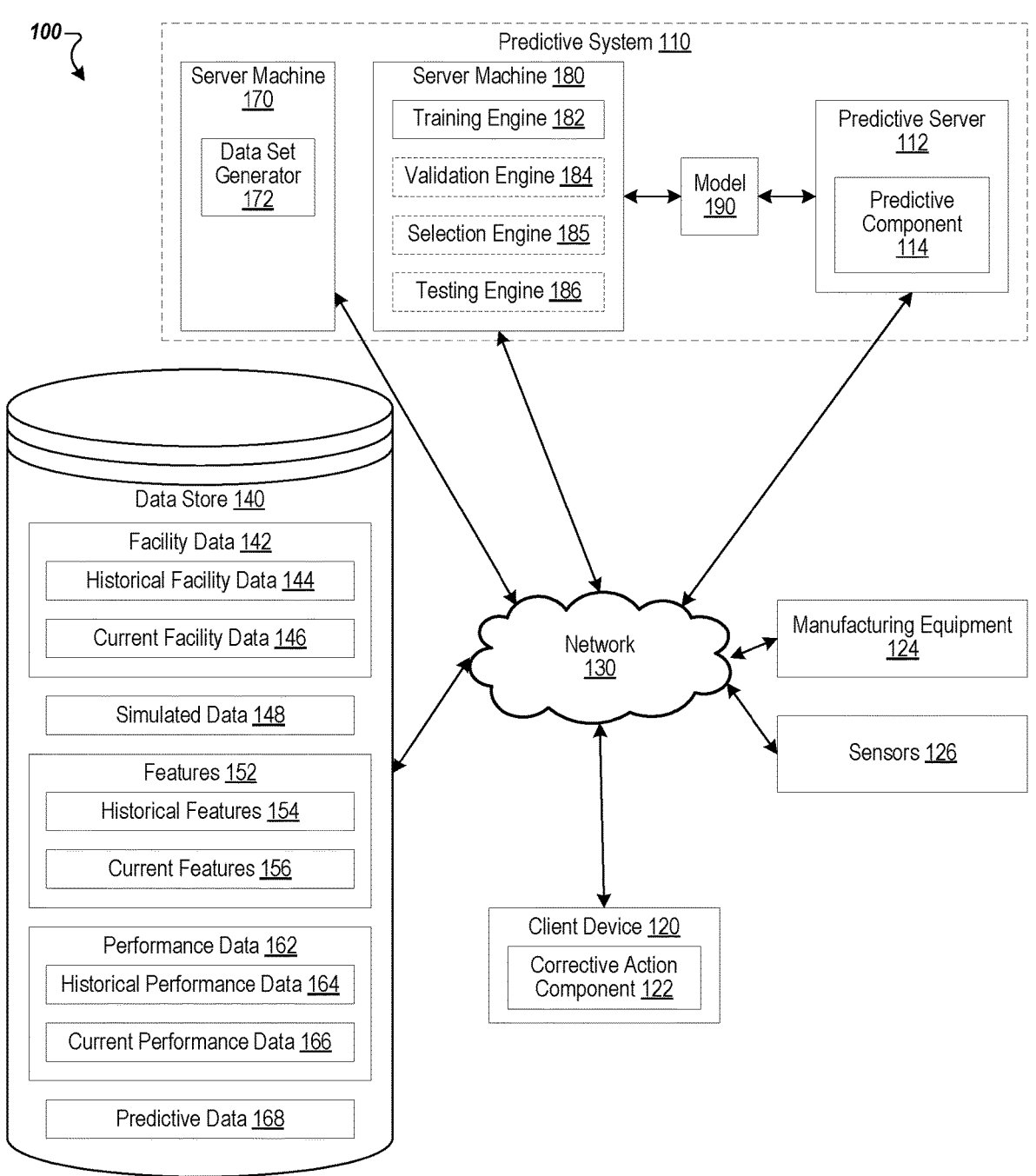
FIG. 1 is a block diagram illustrating an exemplary system architecture, according to certain embodiments.

Described herein are technologies directed to machine learning platforms for substrate processing. Substrate processing includes front-end (e.g., wafer, substrate, semiconductor) manufacturing, back-end (assembly test), etc.

Manufacturing facilities generate products via manufacturing equipment that perform manufacturing processes. For example, substrate processing facilities generate substrates via substrate processing equipment that perform substrate processing operations. A substrate processing facility may include thousands of substrate processing equipment and tens of thousands of substrate lots. A substrate lot can refer to an enclosure system (e.g., substrate carrier, front opening unified pod (FOUP)) that holds substrates (e.g., up to 25 substrates) and that is used to transport substrates in substrate processing facilities (e.g., transport between substrate processing equipment). Substrate lots are transported to different substrate processing equipment for different substrate processing operations at different times of the day. Each substrate may undergo over one thousand individual processing operations from start to finish. Thousands of substrates may be processed each month. Each substrate lot has many options of routes along which to be transported, substrate processing equipment on which to be processed, when to be processed and transported, and in what order to be processed and transported.

Conventionally, operators of substrate processing facilities manually generate schedules for processing of substrate lots and routes for transportation of the substrate lots. These manually generated schedules and routes take lots of time to generate and may not be the most efficient schedules and routes. Interruptions of substrate processing equipment (e.g., equipment failure, component failure, maintenance, etc.) interrupt the schedules and routes. An operator of the substrate processing facility plans some interruptions of substrate processing equipment and reacts to some unexpected interruptions of substrate processing equipment. Manually planning interruptions and manually updating schedules due to unexpected interruptions is time consuming and often do not result in efficient schedules which decreases substrate yield.

The devices, systems, and methods disclosed herein provide machine learning platforms for substrate manufacturing (e.g., for operating a substrate processing facility).

In some embodiments, a processing device identifies historical data associated with substrate lots processed by substrate processing tools in a substrate processing facility. The historical data may include substrate lot data, substrate processing equipment data, substrate processing operations data, substrate lot routes data, etc.

In some embodiments, the processing device generates simulated data for simulated substrate lots processed by simulated substrate processing tools. To generate simulated data, different perturbations to the historical data may be are made, such as adding substrate lots, duplicating substrate lots, removing substrate lots, moving substrate lots forward in their route, moving substrate lots backward in their route, etc. In some embodiments, the processing logic generates simulated data without historical data. For example, the processing logic may use a model based on the substrate processing facility to generate simulated data.

The processing logic generates features. The processing logic may generate features from the historical data for the substrate lots and/or from the simulated data for the simulated substrate lots.

The processing logic trains a machine learning model with data input including the features to generate a trained machine learning model. The trained machine learning model is capable of generating one or more outputs indicative of one or more corrective actions to be performed in the substrate processing facility.

In some embodiments, a machine learning platform receives the historical data and outputs the trained machine learning model. In some embodiments, the machine learning platform receives user input specifying types of features (e.g., feature definition). In some embodiments, the machine learning platform receives user input specifying type of target output (e.g., model definition). In some embodiments, the machine learning platform provides a user interface (e.g., graphical user interface) to receive the historical data, feature definitions, and/or model definitions.

Aspects of the present disclosure result in technological advantages. The present disclosure provides for a processing device generating and updating schedules and routes based on historical facility data and simulated data which takes less time and are more efficient than those that are conventionally made. In some embodiments, the present disclosure uses one or more trained machine learning models to improve choices (e.g., which substrate lots to dispatch) of a dispatching system (e.g., making short-term decision of which substrate lot an idle substrate processing tool is to process next). In some embodiments, the present disclosure uses a machine learning model to make more accurate predictions of when substrate lots are to finish processing and leave the factory (e.g., for a planning system. The present disclosure provides for planning preventative maintenance, etc. when it is most efficient for such planning. The present disclosure saves time and improves yield compared to conventional systems.

FIG. 1 is a block diagram illustrating an exemplary system 100 (exemplary system architecture), according to certain embodiments. The system 100 includes a client device 120, manufacturing equipment 124, sensors 126, a predictive server 112, and a data store 140. In some embodiments, the predictive server 112 is part of a predictive system 110. In some embodiments, the predictive system 110 further includes server machines 170 and 180. One or more of the components (e.g., manufacturing equipment 124, sensors 126, etc.) of system 100 may be part of the same substrate processing facility.

In some embodiments, one or more of the client device 120, manufacturing equipment 124, sensors 126, predictive server 112, data store 140, server machine 170, and/or server machine 180 are coupled to each other via a network 130 for generating predictive data 168 to perform corrective actions. In some embodiments, network 130 is a public network that provides client device 120 with access to the predictive server 112, data store 140, and other publically available computing devices. In some embodiments, network 130 is a private network that provides client device 120 access to manufacturing equipment 124, sensors 126, data store 140, and other privately available computing devices. In some embodiments, network 130 includes one or more Wide Area Networks (WANs), Local Area Networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

In some embodiments, the client device 120 includes a computing device such as Personal Computers (PCs), laptops, mobile phones, smart phones, tablet computers, netbook computers, etc. In some embodiments, the client device 120 includes a corrective action component 122. Client device 120 includes an operating system that allows users to one or more of generate, view, or edit data (e.g., indication associated with manufacturing equipment 124, corrective actions associated with substrate processing facility, etc.).

In some embodiments, corrective action component 122 receives user input (e.g., via a Graphical User Interface (GUI) displayed via the client device 120) of an indication associated with a substrate processing facility (e.g., associated with manufacturing equipment 124). In some embodiments, the corrective action component 122 transmits the indication to the predictive system 110, receives output (e.g., predictive data 168) from the predictive system 110, determines a corrective action associated with the substrate processing facility (e.g., schedules, planning, and/or routes associated with manufacturing equipment 124) based on the output, and causes the corrective action to be implemented. In some embodiments, the corrective action component 122 obtains features 152 (e.g., from data store 140, etc.) and provides the features to the predictive system 110. In some embodiments, the corrective action component 122 stores features 152 in the data store 140 and the predictive server 112 retrieves the facility data 142 from the data store 140. In some embodiments, the predictive server 112 stores output (e.g., predictive data 168) of the trained machine learning model 190 in the data store 140 and the client device 120 retrieves the output from the data store 140. In some embodiments, the corrective action component 122 receives an indication of a corrective action from the predictive system 110 and causes the corrective action to be implemented.

In some embodiments, a corrective action is associated with one or more of scheduling substrate lots, dispatching substrate lots, planning substrate lots, Computational Process Control (CPC), Statistical Process Control (SPC) (e.g., SPC to compare to a graph of 3-sigma, etc.), Advanced Process Control (APC), model-based process control, preventative operative maintenance, design optimization, updating of manufacturing parameters, feedback control, machine learning modification, or the like.

In some embodiments, the corrective action includes updating schedules, routes, preventative maintenance, replacement of components, etc. associated with a substrate processing facility. In some embodiments, the corrective action includes providing an alert (e.g., that an update is to be performed to achieve a particular yield). In some embodiments, the corrective action includes providing feedback control (e.g., modifying schedule or route responsive to the predictive data 168 indicating a particular yield would not be met). In some embodiments, the corrective action includes providing machine learning (e.g., causing modification of a schedule or route based on the predictive data 168).

In some embodiments, the predictive server 112, server machine 170, and server machine 180 each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

The predictive server 112 includes a predictive component 114. In some embodiments, the predictive component 114 receives features 152 (e.g., receive from the client device 120, retrieve from the data store 140) and generates output (e.g., predictive data 168) for performing corrective action associated with the substrate processing facility based on the features 152. In some embodiments, the predictive component 114 uses one or more trained machine learning models 190 to determine the output for performing the corrective action based on the features 152. In some embodiments, trained machine learning model 190 is trained using historical features 154 and/or historical performance data 164.

In some embodiments, the predictive system 110 (e.g., predictive server 112, predictive component 114) generates predictive data 168 using supervised machine learning (e.g., supervised data set). In some embodiments, the predictive system 110 generates predictive data 168 using semi-supervised learning (e.g., semi-supervised data set, performance data 162 is a predictive percentage, etc.). In some embodiments, the predictive system 110 generates predictive data 168 using unsupervised machine learning (e.g., unsupervised data set, clustering, etc.).

In some embodiments, the manufacturing equipment 124 (e.g., cluster tool, substrate processing tool) is part of a substrate processing system (e.g., integrated processing system) in a substrate processing facility. A substrate processing facility may include thousands of sets of manufacturing equipment 124. The manufacturing equipment 124 includes one or more of a controller, an enclosure system (e.g., substrate carrier, FOUP, autoteach FOUP, process kit enclosure system, substrate enclosure system, cassette, etc.), a side storage pod (SSP), an aligner device (e.g., aligner chamber), a factory interface (e.g., equipment front end module (EFEM)), a load lock, a transfer chamber, one or more processing chambers, a robot arm (e.g., disposed in the transfer chamber, disposed in the front interface, etc.), and/or the like. The enclosure system, SSP, and load lock mount to the factory interface and a robot arm disposed in the factory interface is to transfer content (e.g., substrates, process kit rings, carriers, validation wafer, etc.) between the enclosure system, SSP, load lock, and factory interface. The aligner device is disposed in the factory interface to align the content. The load lock and the processing chambers mount to the transfer chamber and a robot arm disposed in the transfer chamber is to transfer content (e.g., substrates, process kit rings, carriers, validation wafer, etc.) between the load lock, the processing chambers, and the transfer chamber.

In some embodiments, the sensors 126 provide facility data 142 associated with manufacturing equipment 124 and/or the substrate processing facility. In some embodiments, the sensors 126 include one or more of a pressure sensor, a temperature sensor, a flow rate sensor, imaging device, and/or the like. In some embodiments, the facility data 142 is received over a period of time.

In some embodiments, the facility data 142 includes values of one or more of substrate lot routes, amount of substrates in each substrate lot, substrate lot processing start and stop time, and/or the like.

In some embodiments, simulated data 148 is generated (e.g., based on the facility data 142). The simulated data 148 may be generated to determine more accurate predictive data 168. The simulated data 148 may be generated by causing perturbations of the facility data 142, such as adding substrate lots, duplicating substrate lots, removing substrate lots, moving substrate lots forward in their route, moving substrate lots backward in their route, changing preventative maintenance schedules, adjusting substrate processing tool qualifications, etc.

In some embodiments, the facility data 142 (e.g., historical facility data 144, current facility data 146, etc.) and/or simulated data 148 are processed (e.g., by the client device 120 and/or by the predictive server 112). In some embodiments, processing of the facility data 142 and/or simulated data 148 includes generating features 152. In some embodiments, the features 152 are a pattern in the facility data 142 and/or simulated data 148 (e.g., slope, width, height, peak, etc.) or a combination of values from the facility data 142 and/or simulated data 148 (e.g., utilization of manufacturing equipment 124 derived from start and stop times, etc.). In some embodiments, the features 152 are used by the predictive component 114 for obtaining predictive data 168 for performance of a corrective action.

In some embodiments, the data store 140 is a memory (e.g., random access memory), a drive (e.g., a hard drive, a flash drive), a database system, or another type of component or device capable of storing data. In some embodiments, data store 140 includes multiple storage components (e.g., multiple drives or multiple databases) that span multiple computing devices (e.g., multiple server computers). In some embodiments, the data store 140 stores one or more of facility data 142, simulated data 148, features 152, performance data 162, and/or predictive data 168.

Facility data 142 includes historical facility data 144 and current facility data 146. In some embodiments, the facility data 142 includes one or more of route data of substrate lot, scheduling data of substrate lots, amount of substrates in each substrate lot, capabilities of manufacturing equipment 124, etc. Simulated data 148 includes perturbations of facility data 142. Features 152 are values derived from facility data 142 and simulated data 148.

Performance data 162 includes historical performance data 164 and current performance data 166. In some embodiments, the performance data 162 is indicative of performance of the substrate processing facility, yield of the substrate processing facility, down time of manufacturing equipment 124 between operations, substrate lot processing completion time, etc.

Predictive Data 168 includes schedules, substrate lot schedule data, substrate lot route data, planning data, etc. Substrate lot schedule data may indicate when substrate lots are to be transported and on which manufacturing equipment 124 are to be processed. Substrate lot route data may indicate over which routes substrate routes are to be transported. Planning data may indicate when preventative maintenance, component replacement, etc. are to occur.

Historical data includes one or more of historical facility data 144, simulated data 148, historical features 154, and/or historical performance data 164 (e.g., at least a portion for training the machine learning model 190). Current data includes one or more of current facility data 146, simulated data 148, current features 156, and/or current performance data 166 (e.g., at least a portion to be input into the trained machine learning model 190 to use the model 190) for which predictive data 168 is generated (e.g., for performing corrective actions). In some embodiments, the current data is used for retraining the trained machine learning model 190.

In some embodiments, predictive system 110 further includes server machine 170 and server machine 180. Server machine 170 includes a data set generator 172 that is capable of generating data sets (e.g., a set of data inputs and a set of target outputs) to train, validate, and/or test a machine learning model(s) 190. Some operations of data set generator 172 are described in detail below with respect to FIGS. 2 and 5A. In some embodiments, the data set generator 172 partitions the historical data (e.g., historical features 154 and historical performance data 164) into a training set (e.g., sixty percent of the historical data), a validating set (e.g., twenty percent of the historical data), and a testing set (e.g., twenty percent of the historical data). In some embodiments, the predictive system 110 (e.g., via predictive component 114) generates multiple sets of features 152. In some examples a first set of features 152 corresponds to a first set of types of facility data 142 and/or simulated data 148 (e.g., from a first set of sensors, first combination of values from first set of sensors, first patterns in the values from the first set of sensors) that correspond to each of the data sets (e.g., training set, validation set, and testing set) and a second set of features 152 correspond to a second set of types of facility data 142 (e.g., from a second set of sensors different from the first set of sensors, second combination of values different from the first combination, second patterns different from the first patterns) that correspond to each of the data sets.

Server machine 180 includes a training engine 182, a validation engine 184, selection engine 185, and/or a testing engine 186. In some embodiments, an engine (e.g., training engine 182, a validation engine 184, selection engine 185, and a testing engine 186) refers to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 182 is capable of training a machine learning model 190 using one or more sets of features 152 associated with the training set from data set generator 172. In some embodiments, the training engine 182 generates multiple trained machine learning models 190, where each trained machine learning model 190 corresponds to a distinct set of features 152 of the training set (e.g., based on facility data 142 from a distinct set of sensors). In some examples, a first trained machine learning model was trained using all features 152 (e.g., X1-X5), a second trained machine learning model was trained using a first subset of the features 152 (e.g., X1, X2, X4), and a third trained machine learning model was trained using a second subset of the features 152 (e.g., X1, X3, X4, and X5) that partially overlaps the first subset of features 152.

The validation engine 184 is capable of validating a trained machine learning model 190 using a corresponding set of features 152 of the validation set from data set generator 172. For example, a first trained machine learning model 190 that was trained using a first set of features 152 of the training set is validated using the first set of features 152 of the validation set. The validation engine 184 determines an accuracy of each of the trained machine learning models 190 based on the corresponding sets of features 152 of the validation set. The validation engine 184 discards trained machine learning models 190 that have an accuracy that does not meet a threshold accuracy. In some embodiments, the selection engine 185 is capable of selecting one or more trained machine learning models 190 that have an accuracy that meets a threshold accuracy. In some embodiments, the selection engine 185 is capable of selecting the trained machine learning model 190 that has the highest accuracy of the trained machine learning models 190.

The testing engine 186 is capable of testing a trained machine learning model 190 using a corresponding set of features 152 of a testing set from data set generator 172. For example, a first trained machine learning model 190 that was trained using a first set of features of the training set is tested using the first set of features 152 of the testing set. The testing engine 186 determines a trained machine learning model 190 that has the highest accuracy of all of the trained machine learning models based on the testing sets.

In some embodiments, the machine learning model 190 refers to the model artifact that is created by the training engine 182 using a training set that includes data inputs and corresponding target outputs (correct answers for respective training inputs). Patterns in the data sets can be found that map the data input to the target output (the correct answer), and the machine learning model 190 is provided mappings that captures these patterns. In some embodiments, the machine learning model 190 uses one or more of Support Vector Machine (SVM), Radial Basis Function (RBF), clustering, supervised machine learning, semi-supervised machine learning, unsupervised machine learning, k-Nearest Neighbor algorithm (k-NN), linear regression, random forest, neural network (e.g., artificial neural network), etc. In some embodiments, the machine learning model 190 is a multi-variable analysis (MVA) model.

Predictive component 114 provides current features 156 to the trained machine learning model 190 and runs the trained machine learning model 190 on the input to obtain one or more outputs. The predictive component 114 is capable of determining (e.g., extracting) predictive data 168 from the output of the trained machine learning model 190 and determines (e.g., extract) confidence data from the output that indicates a level of confidence that the predictive data 168 corresponds to current performance data 166 (e.g., model 190) of the substrate processing facility at the current facility data 146. In some embodiments, the predictive component 114 or corrective action component 122 use the confidence data to decide whether to cause a corrective action associated with the substrate processing facility based on the predictive data 168.

The confidence data includes or indicates a level of confidence that the predictive data 168 corresponds to current performance data 166 (e.g., model 190) of the substrate processing facility at the current facility data 146. In one example, the level of confidence is a real number between 0 and 1 inclusive, where 0 indicates no confidence that the predictive data 168 corresponds to current performance data 166 associated with the current facility data 146 and 1 indicates absolute confidence that the predictive data 168 corresponds to current performance data 166 associated with the current facility data 146. In some embodiments, responsive to the confidence data indicating a level of confidence that is below a threshold level, the system 100 causes processing of substrates based on the predictive data 168 (e.g., schedules, routes, planning, etc.). Responsive to the confidence data indicating a level of confidence below a threshold level for a predetermined number of instances (e.g., percentage of instances, frequency of instances, total number of instances, etc.) the predictive component 114 causes the trained machine learning model 190 to be re-trained (e.g., based on the current features 156 and current performance data 166, etc.).

Figure 2:
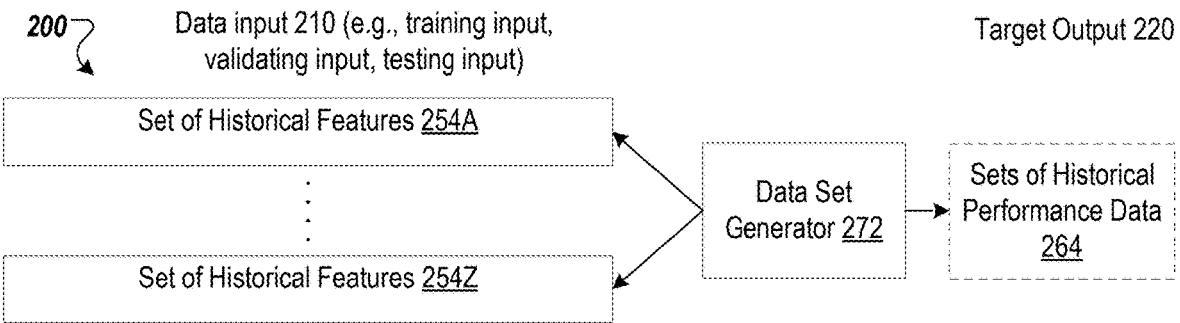
FIG. 2 illustrates a data set generator to create data sets for a machine learning model, according to certain embodiments.

For purpose of illustration, rather than limitation, aspects of the disclosure describe the training of one or more machine learning models 190 using historical data (e.g., historical facility data 144 and historical performance data 164) and inputting current data (e.g., current features 156) into the one or more trained machine learning models 190 to determine predictive data 168 (e.g., current performance data 166). In other implementations, a heuristic model or rule-based model is used to determine predictive data 168 (e.g., without using a trained machine learning model). Predictive component 114 monitors historical features 154 and historical performance data 164. In some embodiments, any of the information described with respect to data inputs 210 of FIG. 2 are monitored or otherwise used in the heuristic or rule-based model.

In some embodiments, the functions of client device 120, predictive server 112, server machine 170, and server machine 180 are be provided by a fewer number of machines. For example, in some embodiments, server machines 170 and 180 are integrated into a single machine, while in some other embodiments, server machine 170, server machine 180, and predictive server 112 are integrated into a single machine. In some embodiments, client device 120 and predictive server 112 are integrated into a single machine.

In general, functions described in one embodiment as being performed by client device 120, predictive server 112, server machine 170, and server machine 180 can also be performed on predictive server 112 in other embodiments, if appropriate. In addition, the functionality attributed to a particular component can be performed by different or multiple components operating together. For example, in some embodiments, the predictive server 112 determines the corrective action based on the predictive data 168. In another example, client device 120 determines the predictive data 168 based on output from the trained machine learning model.

In addition, the functions of a particular component can be performed by different or multiple components operating together. In some embodiments, one or more of the predictive server 112, server machine 170, or server machine 180 are accessed as a service provided to other systems or devices through appropriate application programming interfaces (API).

In some embodiments, a "user" is represented as a single individual. However, other embodiments of the disclosure encompass a "user" being an entity controlled by a plurality of users and/or an automated source. In some examples, a set of individual users federated as a group of administrators is considered a "user."

Although embodiments of the disclosure are discussed in terms of generating predictive data 168 to perform a corrective action in manufacturing facilities (e.g., substrate processing facilities), in some embodiments, the disclosure can also be generally applied to causing corrective actions for scheduling, routing, dispatching, and planning.

FIG. 2 illustrates a data set generator 272 (e.g., data set generator 172 of FIG. 1) to create data sets for a machine learning model (e.g., model 190 of FIG. 1), according to certain embodiments. In some embodiments, data set generator 272 is part of server machine 170 of FIG. 1.

Data set generator 272 (e.g., data set generator 172 of FIG. 1) creates data sets for a machine learning model (e.g., model 190 of FIG. 1). Data set generator 272 creates data sets using historical features 254A-Z (e.g., historical features 154 of FIG. 1). In some embodiments, data set generator 272 creates data sets also using historical performance data 264 (e.g., historical performance data 164 of FIG. 1). System 200 of FIG. 2 shows data set generator 272, data inputs 210, and target output 220.

In some embodiments, data set generator 272 generates a data set (e.g., training set, validating set, testing set) that includes one or more data inputs 210 (e.g., training input, validating input, testing input) and one or more target outputs 220 that correspond to the data inputs 210. In some embodiments, the data set also includes mapping data that maps the data inputs 210 to the target outputs 220. Data inputs 210 are also referred to as "features," "attributes," or information." In some embodiments, data set generator 272 provides the data set to the training engine 182, validating engine 184, or testing engine 186, where the data set is used to train, validate, or test the machine learning model 190. Some embodiments of generating a training set are further described with respect to FIG. 5A.

In some embodiments, data set generator 272 generates the data input 210 and target output 220. In some embodiments, data inputs 210 include one or more sets of historical features 254. In some embodiments, historical features 254 include one or more of parameters from one or more types of sensors, combination of parameters from one or more types of sensors, patterns from parameters from one or more types of sensors, dimensions of substrates, simulated data, and/or the like.

In some embodiments, data set generator 272 generates a first data input corresponding to a first set of features 254A to train, validate, or test a first machine learning model and the data set generator 272 generates a second data input corresponding to a second set of historical features 254B to train, validate, or test a second machine learning model.

In some embodiments, the data set generator 272 discretizes (e.g., segments) one or more of the data input 210 or the target output 220 (e.g., to use in classification algorithms for regression problems). Discretization (e.g., segmentation via a sliding window) of the data input 210 or target output 220 transforms continuous values of variables into discrete values. In some embodiments, the discrete values for the data input 210 indicate discrete historical features 254 to obtain a target output 220 (e.g., discrete historical performance data 264).

Data inputs 210 and target outputs 220 to train, validate, or test a machine learning model include information for a particular facility (e.g., for a particular substrate manufacturing facility). In some examples, historical features 254 and historical performance data 264 are for the same manufacturing facility.

In some embodiments, the information used to train the machine learning model is from specific types of manufacturing equipment 124 of the manufacturing facility having specific characteristics and allow the trained machine learning model to determine outcomes for a specific group of manufacturing equipment 124 based on input for current parameters (e.g., current features 156) associated with one or more components sharing characteristics of the specific group. In some embodiments, the information used to train the machine learning model is for components from two or more manufacturing facilities and allows the trained machine learning model to determine outcomes for components based on input from one manufacturing facility.

In some embodiments, subsequent to generating a data set and training, validating, or testing a machine learning model 190 using the data set, the machine learning model 190 is further trained, validated, or tested (e.g., current performance data 166 of FIG. 1) or adjusted (e.g., adjusting weights associated with input data of the machine learning model 190, such as connection weights in a neural network).

Figure 3:
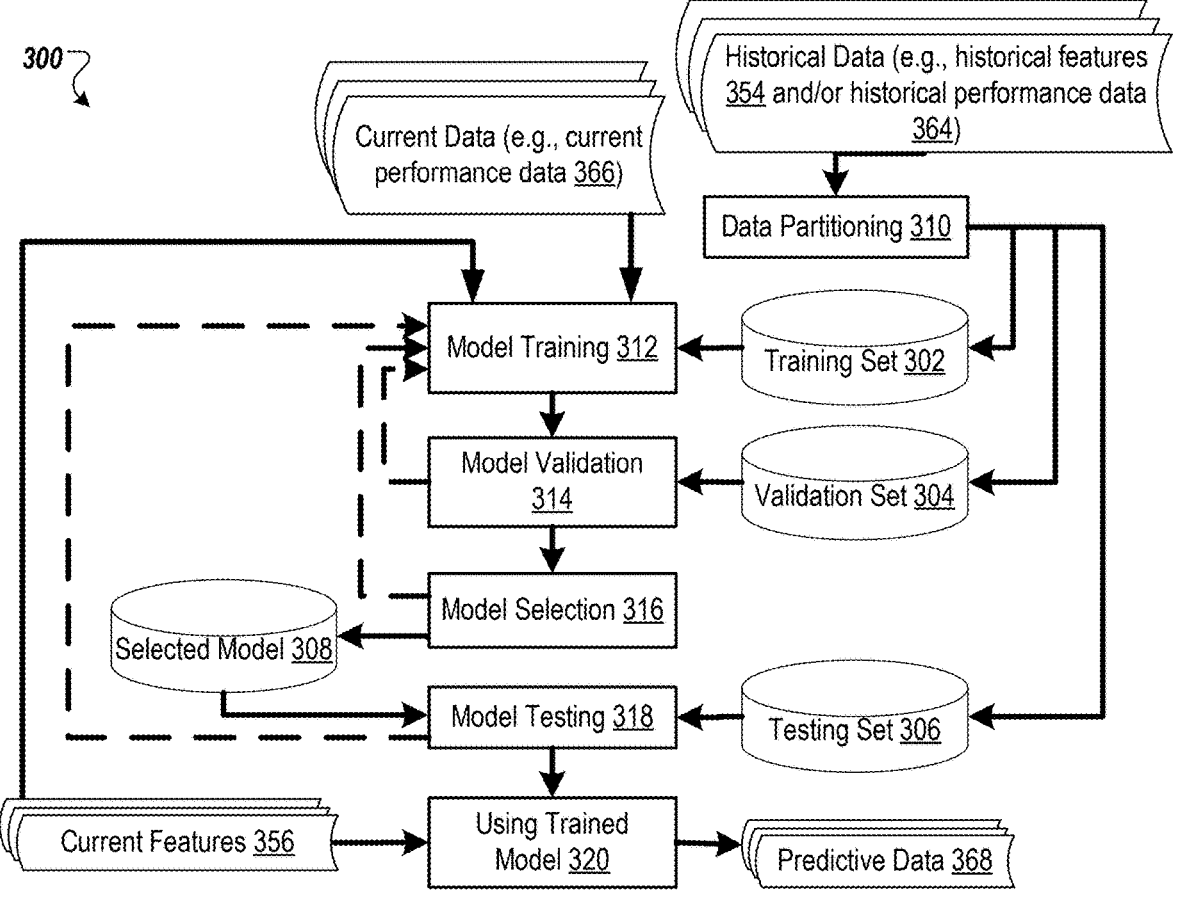
FIG. 3 is a block diagram illustrating determining predictive data, according to certain embodiments.

FIG. 3 is a block diagram illustrating a system 300 for generating predictive data 368 (e.g., predictive data 168 of FIG. 1), according to certain embodiments. The system 300 is used to determine predictive data 368 (e.g., via model 190 of FIG. 1) to cause a corrective action (e.g., associated with manufacturing equipment 124).

At block 310, the system 300 (e.g., predictive system 110 of FIG. 1) performs data partitioning (e.g., via data set generator 172 of server machine 170 of FIG. 1) of the historical data (e.g., historical features 354 and historical performance data 364 for model 190 of FIG. 1) to generate the training set 302, validation set 304, and testing set 306. In some examples, the training set is 60% of the historical data, the validation set is 20% of the historical data, and the testing set is 20% of the historical data. The system 300 generates a plurality of sets of features for each of the training set, the validation set, and the testing set. In some examples, if the historical data includes features derived from facility data from 20 sensors (e.g., sensors 126 of FIG. 1) and 100 products (e.g., products that each correspond to the facility data from the 20 sensors), a first set of features is sensors 1-10, a second set of features is sensors 11-20, the training set is products 1-60, the validation set is products 61-80, and the testing set is products 81-100. In this example, the first set of features of the training set would be facility data from sensors 1-10 for products 1-60.

At block 312, the system 300 performs model training (e.g., via training engine 182 of FIG. 1) using the training set 302. In some embodiments, the system 300 trains multiple models using multiple sets of features of the training set 302 (e.g., a first set of features of the training set 302, a second set of features of the training set 302, etc.). For example, system 300 trains a machine learning model to generate a first trained machine learning model using the first set of features in the training set (e.g., facility data from sensors 1-10 for products 1-60) and to generate a second trained machine learning model using the second set of features in the training set (e.g., facility data from sensors 11-20 for products 1-60). In some embodiments, the first trained machine learning model and the second trained machine learning model are combined to generate a third trained machine learning model (e.g., which is a better predictor than the first or the second trained machine learning model on its own in some embodiments). In some embodiments, sets of features used in comparing models overlap (e.g., first set of features being facility data from sensors 1-15 and second set of features being sensors 5-20). In some embodiments, hundreds of models are generated including models with various permutations of features and combinations of models.

At block 314, the system 300 performs model validation (e.g., via validation engine 184 of FIG. 1) using the validation set 304. The system 300 validates each of the trained models using a corresponding set of features of the validation set 304. For example, system 300 validates the first trained machine learning model using the first set of features in the validation set (e.g., facility data from sensors 1-10 for products 61-80) and the second trained machine learning model using the second set of features in the validation set (e.g., facility data from sensors 11-20 for products 61-80). In some embodiments, the system 300 validates hundreds of models (e.g., models with various permutations of features, combinations of models, etc.) generated at block 312. At block 314, the system 300 determines an accuracy of each of the one or more trained models (e.g., via model validation) and determines whether one or more of the trained models has an accuracy that meets a threshold accuracy. Responsive to determining that none of the trained models has an accuracy that meets a threshold accuracy, flow returns to block 312 where the system 300 performs model training using different sets of features of the training set. Responsive to determining that one or more of the trained models has an accuracy that meets a threshold accuracy, flow continues to block 316. The system 300 discards the trained machine learning models that have an accuracy that is below the threshold accuracy (e.g., based on the validation set).

At block 316, the system 300 performs model selection (e.g., via selection engine 185 of FIG. 1) to determine which of the one or more trained models that meet the threshold accuracy has the highest accuracy (e.g., the selected model 308, based on the validating of block 314). Responsive to determining that two or more of the trained models that meet the threshold accuracy have the same accuracy, flow returns to block 312 where the system 300 performs model training using further refined training sets corresponding to further refined sets of features for determining a trained model that has the highest accuracy.

At block 318, the system 300 performs model testing (e.g., via testing engine 186 of FIG. 1) using the testing set 306 to test the selected model 308. The system 300 tests, using the first set of features in the testing set (e.g., facility data from sensors 1-10 for products 81-100), the first trained machine learning model to determine the first trained machine learning model meets a threshold accuracy (e.g., based on the first set of features of the testing set 306). Responsive to accuracy of the selected model 308 not meeting the threshold accuracy (e.g., the selected model 308 is overly fit to the training set 302 and/or validation set 304 and is not applicable to other data sets such as the testing set 306), flow continues to block 312 where the system 300 performs model training (e.g., retraining) using different training sets corresponding to different sets of features (e.g., facility data from different sensors). Responsive to determining that the selected model 308 has an accuracy that meets a threshold accuracy based on the testing set 306, flow continues to block 320. In at least block 312, the model learns patterns in the historical data to make predictions and in block 318, the system 300 applies the model on the remaining data (e.g., testing set 306) to test the predictions.

At block 320, system 300 uses the trained model (e.g., selected model 308) to receive current features 356 (e.g., current features 156 of FIG. 1) and determines (e.g., extracts), from the output of the trained model, predictive data 368 (e.g., predictive data 168 of FIG. 1) to perform corrective actions associated with the substrate processing facility. In some embodiments, the current features 356 corresponds to the same types of features in the historical features 354. In some embodiments, the current features 356 corresponds to a same type of features as a subset of the types of features in historical features 354 that are used to train the selected model 308.

In some embodiments, current data is received. In some embodiments, current data includes current performance data 366 (e.g., current performance data 166 of FIG. 1). In some embodiments, the current data is received via user input. The model 308 is re-trained based on the current data. In some embodiments, a new model is trained based on the current data and the current facility data 346.

In some embodiments, one or more of the operations 310-320 occur in various orders and/or with other operations not presented and described herein. In some embodiments, one or more of operations 310-320 are not be performed. For example, in some embodiments, one or more of data partitioning of block 310, model validation of block 314, model selection of block 316, and/or model testing of block 318 are not be performed.

Figure 4:
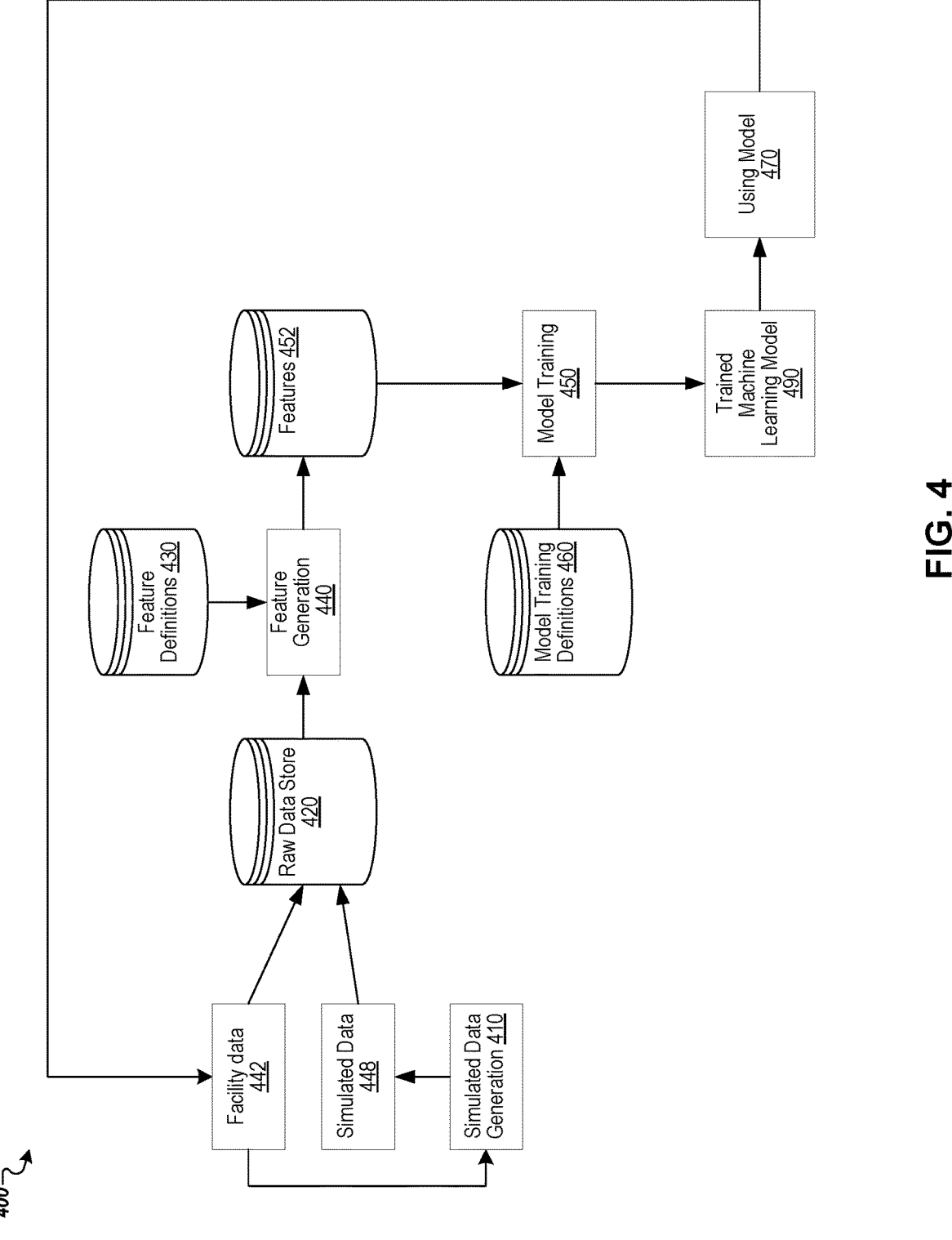
FIG. 4 illustrates a system to determine predictive data, according to certain embodiments.

FIG. 4 illustrates a system 400 to determine predictive data, according to certain embodiments.

System 400 receives facility data 442 (e.g., facility data 142 of FIG. 1). The facility data 442 may be data associated with transporting substrate lots, processing substrate lots, substrate processing equipment, schedules associated with processing substrate lots, dispatching associated with substrate lots, planning associated with substrate lots (e.g., planning preventative maintenance), routes of substrate lots, etc. The facility data 442 may be historical data. In some embodiments, the facility data 442 is historical data of substrate lot processing start and/or finish time at each substrate processing tool. In some embodiments, the facility data 442 is extracted from fab computer-integrated manufacturing (CIM) systems (e.g., manufacturing execution system (MES)).

At block 410 (e.g., model generator, simulated data generator), simulated data 448 is generated. In some embodiments, at block 410 facility data 442 is received and simulated data 448 is generated based on the facility data 442. In some embodiments, a model is used to generate the simulated data 448 (e.g., with or without facility data 442). The simulated data 448 may be generated by perturbing the facility data 442 by adding substrate lots, duplicating substrate lots, removing substrate lots, moving substrate lots forward in their route, moving substrate lots backward in their route, etc. For simulated data 448, historical data or current state data from the substrate processing facility may be used to create a simulation model of the substrate processing facility and the simulation model is run to generate simulation data 448. In some embodiments, the simulation model is perturbed to create additional simulation models. Perturbations include adding substrate lots, duplicating substrate lots, removing substrate lots, moving substrate lots forward or backward in the substrate lot routes, perturbing planned preventative maintenance, perturbing tool downs (e.g., substrate processing tool not being usable), etc. In some embodiments, system 400 may receive user input configuring custom perturbations to generate simulated data 448. In some embodiments, block-based workflow and data processing environments may be used for generating of the simulated data 448 (e.g., via user input configuring custom perturbations).

The raw data store 420 (e.g., data store 140 of FIG. 1) receives the facility data 442 and/or the simulated data 448 (e.g., raw data includes facility data 442 and/or simulated data). The raw data is separated from features 452 (e.g., feature definitions 430) which allows pre-calculating of features 452 (e.g., pre-defining feature definitions 430) to avoid re-calculating features 452 (e.g., avoid re-calculating feature definitions 430) each time features 452 are to be used. The raw data store 420 may include one or more of a database, flat files on disk, cloud blob storage, etc.

Feature definitions 430 (e.g., types of features) may be stored in a data store. At least a portion of the feature definitions 430 may be predetermined (e.g., standard feature definitions). At least a portion of the feature definitions 430 may be user-defined (e.g., the feature definitions 430 start with standard definitions to which a customer may add additional feature definitions). For example, user input may be received specifying one or more types of features. In some embodiments, the feature definitions 430 are stored in a data store (e.g., database) to be reused for training additional machine learning models.

At block 440 (e.g., feature generator, feature calculator, etc.), the facility data 442 and/or simulated data 448 are received from the raw data store 420 and feature definitions 430 are received. Features 452 (e.g., features 152 of FIG. 1, factory state features, etc.) are generated and may be stored in a data store. Features 452 may include number of substrate lots in progress (e.g., substrates in the substrate lot are being processed by substrate processing tool), station utilization (e.g., percentage of the time that a substrate processing tool is processing substrates, etc.), etc.

The features 452 may be calculated and stored for training machine learning models. The raw data from a simulation (e.g., simulation data 448) and/or fab (e.g., facility data 442) may be processed to produce the features 452. In some examples, the feature of tool utilization may be calculated based on a processing data and other event data for the substrate processing tool. The features 452 may be calculated in parallel using one or more of: multiple CPUs in parallel on one or more computing devices; cloud virtual machines (VMs) (e.g., batch processing VMs); containers on a cluster; etc. At least a portion of the features 452 (e.g., feature definitions 430) may be pre-defined. At least a portion of the features 452 (e.g., feature definitions 430) may be defined by a user. Features 452 may be defined by a user using block-based workflow and data processing environments.

Model training definitions 460 (e.g., machine learning model training definitions) may be stored in a data store. The model training definitions 460 may indicate data input and/or target output to train a model. In some embodiments, one or more of the model training definitions 460 are predetermined (e.g., model training definitions 460 start with standard model training definitions to which customers can add additional model training definitions). In some embodiments, one or more of the model training definitions 460 are generated based on user input (e.g., user input indicating data input and/or target output).

At block 450, (e.g., training engine 182 of FIG. 1), features 452 and a model training definition 460 are retrieved. A trained machine learning model 490 (e.g., model 190 of FIG. 1) is generated based on the features 452 and the model training definition 460. System 400 may support training multiple types of machine learning models 490. System 400 may include pre-defined types of machine learning models 490. One or more of the machine learning models 490 may be of a type of machine learning model that is configured by a user (e.g., via python, R, block-based workflow and data processing environments, etc.). After being trained, a trained machine learning model 490 can be passed to other fab systems that are to use the trained machine learning model 490.

At block 470, the trained machine learning model 490 is used. For example, the trained machine learning model 490 may be used by one or more of a dispatching, scheduling, and/or planning system. In some examples, a dispatching system provides current features based on current data to the trained machine learning model 490 and receives output (e.g., predictive data 168) indicative of substrate lot routes (e.g., when and how to dispatch each substrate lot). In some examples, a scheduling system provides current features based on current data to the trained machine learning model 490 and receives output (e.g., predictive data 168) indicative of a schedule for processing substrate lots. In some examples, a planning system provides current features based on current data to the trained machine learning model 490 and receives output (e.g., predictive data 168) indicative of when to plan events (e.g., preventative maintenance, component replacement, corrective actions, etc.). In some examples, a dispatching system may use the trained machine learning model 490 to decide which substrate lot is to be processed next by an idle substrate processing tool. In some examples, a planning system may use the trained machine learning model 490 to change the priority of a substrate lot that is predicted to ship late.

Dispatching, scheduling, and planning systems use the trained machine learning model 190 to: dispatch substrate lots to substrate processing tools; create schedules; and/or determining whether a substrate lot is to be prioritized.

Additional facility data 442 is generated responsive to using of the trained machine learning model 490 at block 470 (e.g., responsive to dispatching, scheduling, and/or planning systems using the trained machine learning model 490). Blocks 410, 440, 450, and/or 470 may be repeated (e.g., to train new machine learning models 490, to re-train trained machine learning models 490). System 400 may support different methods of triggering a new machine learning model 490 to be trained. System 400 may receive user input triggering a new machine learning model 490 to be trained (e.g., via user manually triggering through the user interface). System 400 may train or re-train a machine learning model 490 in response to a fab event. System 400 may train or re-train a machine learning model 490 on a schedule (e.g., every day at noon). System 400 may support passing a trained machine learning model 490 directly to external systems after the trained machine learning model 490 has been trained. System 400 may support holding a model so that a user can examine the key performance indices and other values before the trained machine learning model 490 is passed to another system. The initial trained machine learning model 490 may be referred to as a preliminary model which is then promoted to a production model (e.g., after being approved for use by other systems).

In machine learning, running simulations, calculating features from raw historical or simulated data, and/or training machine learning models may be computation-intensive. System 400 allows several methods for running simulations, calculating features, and/or training machine learning models in parallel. System 400 manages the parallel computations and can provide a notification when the parallel computations are complete. System 400 may perform methods for running simulations, calculating features, and/or training machine learning models in parallel by one or more of running on multiple cores on a local machine, running on multiple cores across several physical machines, running in the cloud using VMs or on-demand VMs, running in containers on a local or cloud cluster, etc.

System 400 may provide a user interface (e.g., machine learning platform) that supports one or more of triggering a new machine learning model training (e.g., receive user input via user interface to generate a new machine learning model), triggering extraction of historical fab data (e.g., historical facility data 144) and current fab data (e.g., current facility data 146), examining the key performance indices and other analytics for a trained model (e.g., R-squared and AUC (area under the curve) values, AUC charts, etc.), promoting a preliminary model to production, starting and managing sets of simulation runs (e.g., configuring the model perturbations), calculating features, etc.

The user workflow in system 400 may include creating data for training. Creating data for training may include selecting base model or models. If using simulated data, creating data for training may further include defining model perturbations, defining how to do runs (e.g., local machine, cloud, etc.), and starting the runs. The user workflow may further include selecting features (e.g., data input) and predicted values (e.g., target output) for the machine learning model, selecting one or more machine learning models (e.g., selecting one or more algorithms to use in the machine learning model, such as regression, deep learning, etc.), and running the one or more machine learning models, examining results to select a machine learning model (e.g., most accurate of the machine learning models). If the most accurate machine learning model is not accurate enough, iterations may occur of creating more simulated data, using more historical data, including features, and/or excluding features.

Figure 5A:
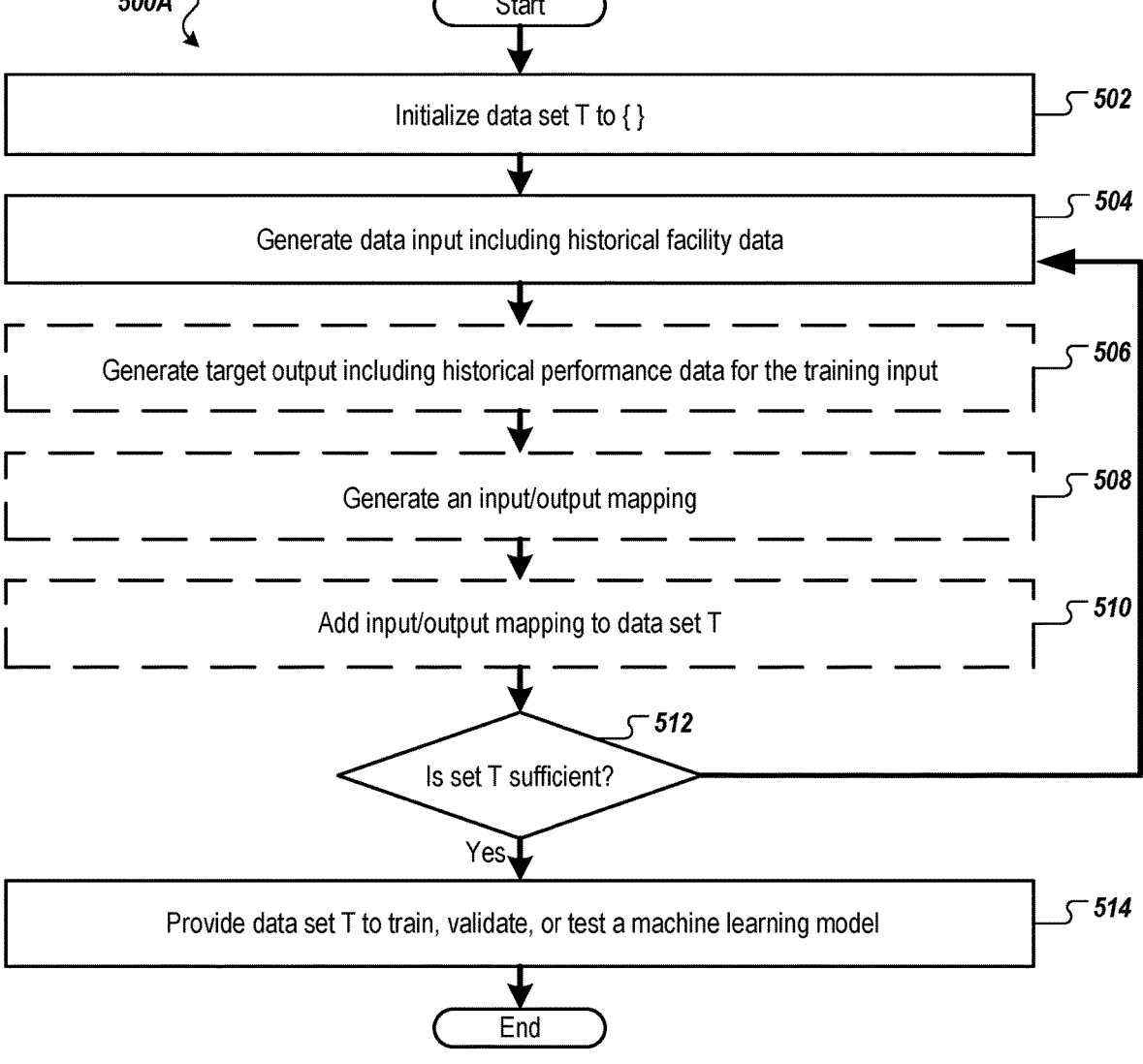
Figure 5B:
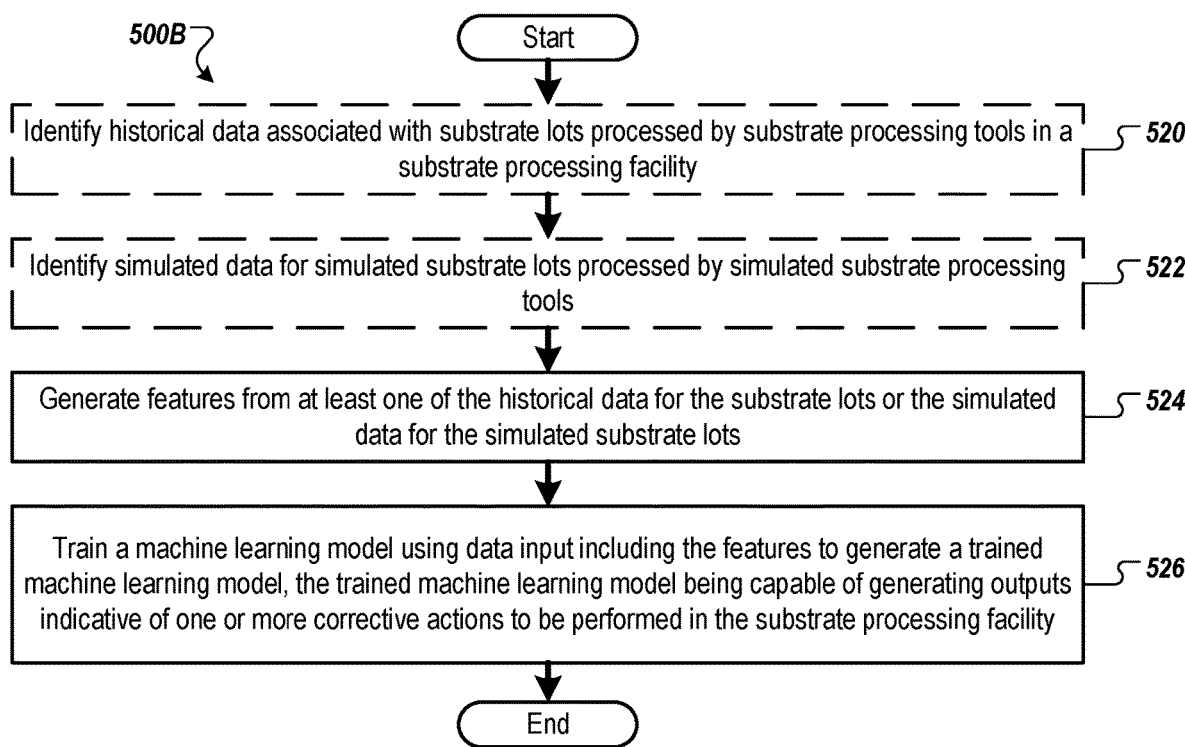

FIGS. 5A-C are flow diagrams of methods 500A-C associated with determining predictive data, according to certain embodiments. In some embodiments, methods 500A-C are performed by processing logic that includes hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, methods 500A-C are performed, at least in part, by predictive system 110. In some embodiments, method 500A is performed, at least in part, by predictive system 110 (e.g., server machine 170 and data set generator 172 of FIG. 1, data set generator 272 of FIG. 2). In some embodiments, predictive system 110 uses method 500A to generate a data set to at least one of train, validate, or test a machine learning model. In some embodiments, method 500B is performed by server machine 180 (e.g., training engine 182, etc.). In some embodiments, method 500C is performed by predictive server 112 (e.g., predictive component 114). In some embodiments, a non-transitory storage medium stores instructions that when executed by a processing device (e.g., of predictive system 110, of server machine 180, of predictive server 112, etc.), cause the processing device to perform one or more of methods 500A-C.

For simplicity of explanation, methods 500A-C are depicted and described as a series of operations. However, operations in accordance with this disclosure can occur in various orders and/or concurrently and with other operations not presented and described herein. Furthermore, in some embodiments, not all illustrated operations are performed to implement methods 500A-C in accordance with the disclosed subject matter. In addition, those skilled in the art will understand and appreciate that methods 500A-C could alternatively be represented as a series of interrelated states via a state diagram or events.

FIG. 5A is a flow diagram of a method 500A for generating a data set for a machine learning model for generating predictive data (e.g., predictive data 168 of FIG. 1), according to certain embodiments.

Referring to FIG. 5A, in some embodiments, at block 502 the processing logic implementing method 500A initializes a training set T to an empty set.

At block 504, processing logic generates first data input (e.g., first training input, first validating input) that includes historical facility data (e.g., historical facility data 144 of FIG. 1, historical facility data 244 of FIG. 2).

In some embodiments, at block 506, processing logic generates a first target output for one or more of the data inputs (e.g., first data input). In some embodiments, the first target output is historical performance data (e.g., historical performance data 164 of FIG. 1, historical performance data 264 of FIG. 2).

In some embodiments, at block 508, processing logic generates mapping data that is indicative of an input/output mapping. The input/output mapping (or mapping data) refers to the data input (e.g., one or more of the data inputs described herein), the target output for the data input (e.g., where the target output identifies historical performance data 164), and an association between the data input(s) and the target output.

In some embodiments, at block 510, processing logic adds the mapping data generated at block 536 to data set T (e.g., supervised learning). In some embodiments (e.g., unsupervised learning), target output and mapping data is not used. The data input may be used (e.g., machine learning performs clustering of the data input).

At block 512, processing logic branches based on whether data set T is sufficient for at least one of training, validating, and/or testing machine learning model 190. If so, execution proceeds to block 514, otherwise, execution continues back at block 504. It should be noted that in some embodiments, the sufficiency of data set T is determined based simply on the number of input/output mappings in the data set, while in some other implementations, the sufficiency of data set T is determined based on one or more other criteria (e.g., a measure of diversity of the data examples, accuracy, etc.) in addition to, or instead of, the number of input/output mappings.

At block 514, processing logic provides data set T (e.g., to server machine 180) to train, validate, and/or test machine learning model 190. In some embodiments, data set T is a training set and is provided to training engine 182 of server machine 180 to perform the training. In some embodiments, data set T is a validation set and is provided to validation engine 184 of server machine 180 to perform the validating. In some embodiments, data set T is a testing set and is provided to testing engine 186 of server machine 180 to perform the testing. In the case of a neural network, for example, input values of a given input/output mapping (e.g., numerical values associated with data inputs 210) are input to the neural network, and output values (e.g., numerical values associated with target outputs 220) of the input/output mapping are stored in the output nodes of the neural network. The connection weights in the neural network are then adjusted in accordance with a learning algorithm (e.g., back propagation, etc.), and the procedure is repeated for the other input/output mappings in data set T. After block 514, machine learning model (e.g., machine learning model 190) can be at least one of trained using training engine 182 of server machine 180, validated using validating engine 184 of server machine 180, or tested using testing engine 186 of server machine 180. The trained machine learning model is implemented by predictive component 114 (of predictive server 112) to generate predictive data 168 for performing corrective action associated with the substrate processing facility.

FIG. 5B is a method 500B of operating a substrate processing facility. The method 500B may be for training a machine learning model (e.g., model 190 of FIG. 1) for determining predictive data (e.g., predictive data 168 of FIG. 1) to perform a corrective action.

Referring to FIG. 5B, at block 520 of method 500B, in some embodiments, the processing logic identifies (e.g., receives) historical data (e.g., historical facility data, historical performance data) associated with historical substrate lots processed by substrate processing tools in a substrate processing facility.

Each substrate lot may be a group of substrates stored within an enclosure (e.g., FOUP). The group of substrates may be processed by a same substrate processing tool with the same process (e.g., all of the substrates in the same FOUP may undergo the same etch operations by the same processing chambers).

At block 522, in some embodiments, processing logic generates simulated data (e.g., simulated facility data, simulated performance data, etc.) for simulated substrate lots processed by simulated substrate processing tools.

At block 524, processing logic generates features from the historical data for the substrate lots and/or from the simulated data for the simulated substrate lots. In some embodiments, the features may be stored in a data store to be reused for training additional machine learning models without regenerating the features. In some embodiments, the processing logic receives user input specifying one or more types of features (e.g., feature definitions) and the generating of the features at block 524 is based on the use input. In some embodiments, the processing logic identifies predetermined types of features (e.g., feature definitions) and the generating of the features at block 524 is based on the predetermined types of features.

At block 526, processing logic trains a machine learning model using data input including the features to generate a trained machine learning model. The trained machine learning model is capable of generating outputs indicative of one or more corrective actions to be performed in the substrate processing facility. The corrective actions may increase output of the substrate processing facility, increase yield of processed substrates, select an order to process lots on a substrate processing tool to reduce number of setups of substrate processing tools, increase life of a component or substrate processing tool, reduce energy or processor overhead used, use less bandwidth, use less material, etc. The corrective actions may include one or more of substrate lot scheduling, substrate lot dispatching, substrate lot planning, providing an alert, updating manufacturing parameters (e.g., hardware parameters, process parameters, etc.), interrupting operation of a substrate processing tool, etc.

In some embodiments, the processing logic receives user selection of the machine learning model from a plurality of predetermined machine learning models (e.g., machine learning model definitions) associated with predetermined types of target output. In some embodiments, the processing logic receives user input specifying a first type of target output (e.g., a machine learning definition) and generates the target output based on the first type of target output and at least one of the historical data or the simulated data. The training of the machine learning model at block 526 may be further based on the target output.

In some embodiments, processing logic provides a machine learning platform (e.g., user interface, graphical user interface). The processing logic receives, via the machine learning platform, the historical data and outputs, via the machine learning platform, the trained machine learning model. In some embodiments, the processing logic receives, via the machine learning platform, user input specifying types of features (e.g., feature definition). In some embodiments, the processing logic receives, via the machine learning platform, user input specifying type of target output (e.g., model definition).

The machine learning platform may generate and manage data (e.g., fab manufacturing data), manage features calculated from the historical data, and manage the generation of machine learning models from the historical data. The machine learning model may be used to collect, create, and manage data for machine learning and to train and evaluate new machine learning models (e.g., without additional programming). The machine learning platform may allow the end user to add new types of features (e.g., feature definitions) and types of machine learning models (e.g., model definitions) (e.g., without additional programming). A user of the machine learning platform may be managed by a user that does not have programming and database skills. The machine learning platform gives the user the ability to generate, train, and publish machine learning models (e.g., conventionally performed by a programmer) without performing programming. The machine learning platform may be used to perform machine learning, improve fab productivity, and perform fab simulation.

FIG. 5C is a method 500C for using a trained machine learning model (e.g., model 190 of FIG. 1) to cause performance of a corrective action.

Referring to FIG. 5C, at block 540 of method 500C, the processing logic receives current data (e.g., current facility data) associated with current substrate lots of a substrate processing facility. The current data may include data associated with one or more of current substrate lots to be processed, amount and/or type of substrates in the current substrate lots, available substrate lot routes in the substrate processing facility, available substrate processing tools, preventative maintenance to be performed on the substrate processing tools, etc. In some examples, the current data includes substrate lot processing start times and processing finish times for each of the substrate lots at the substrate processing tools in the substrate processing facility.

The machine learning platform may be a software platform that enables building, deploying, and monitoring machine learning models (e.g., artificial intelligence (AI), machine learning, and reinforcement learning) that are used for dispatching, scheduling, and/or planning of substrate lots (e.g., wafer lots) in a substrate processing facility (e.g., semiconductor fab).

The processing logic may perform data management by using historical data and/or simulated data (e.g., a combination of historical and simulated data), save raw data, and save calculated features. The processing logic may allow the user multiple methods for processing data in parallel. The processing logic may perform machine learning model lifecycle management which includes publishing machine learning models to external systems.

At block 542, the processing logic identifies current features from the current facility data. The current features may be the same type of features (e.g., feature definition) as the features of block 524. In some embodiments, the current features are retrieved from a data store without regenerating the current features. In some embodiments, processing logic retrieves the type of features (e.g., feature definitions) from a data store and the processing logic generates the features based on the type of features. In some embodiments, the processing logic receives user input specifying one or more types of features (e.g., feature definitions) and generates the current features based on the user input. In some examples, a current feature is utilization of a substrate processing tool (e.g., how busy a substrate processing tool is, percentage of downtime of a substrate processing tool, percentage of time a substrate processing tool is operating, hours per day a substrate processing tool is operating, etc.).

At block 544, the processing logic provides the current features as input to a trained machine learning model. The trained machine learning model may be the trained machine learning model of block 526. The trained machine learning model may have been trained based on historical features that were generated based on historical data (e.g., historical facility data, historical performance data, etc.) for historical substrate lots and/or simulated data for simulated substrate lots.

In some embodiments, the processing logic receives user input specifying a first type of target output and the trained machine learning model is generated (e.g., trained) based on the first type of target output and at least one of historical data or simulated data. In some embodiments, the processing logic receives selection of the trained machine learning model from predetermined trained machine learning models associated with predetermined types of target output.

At block 546, processing logic obtains, from the trained machine learning model, one or more outputs (e.g., predictive data 168 of FIG. 1). The one or more outputs may include predictive data. In some examples, the predictive data is indicative of predicted substrate lot cycle time (e.g., an amount of time for a substrate lot to finish the substrate lot route, predicted time of when a substrate lot is going to finish being processed). In some examples, the predictive data is indicative of whether substrate lots are to finish in time to satisfy an order.

At block 548, the processing logic causes, based on the one or more outputs, performance of a corrective action associated with the substrate processing facility. The corrective action may include one or more of substrate lot scheduling (e.g., which substrate processing tools are to process which substrate lots at what time), substrate lot dispatching (e.g., deciding which substrate lot that an idle substrate processing tool is going to process next), substrate lot planning (e.g., whether substrate lots are going to be processed on time, prioritizing substrate lots, planning preventative maintenance on a substrate processing too), etc. In some examples, the processing logic causes an update to substrate lot routes, substrate lot dispatching, substrate lot planning (e.g., planning of preventative maintenance), etc.

In some examples, responsive to the output indicating a predicted substrate lot cycle time (e.g., when substrate lots will finish being processed) that does not meet a threshold time (e.g., would be later than the order time), the corrective action includes bringing more substrate processing tools online, rescheduling preventative maintenance, speeding up transporting of substrate lots, increasing the number of hours of substrate lot processing per day, prioritizing substrate lots corresponding to the order, qualifying new substrate processing tools for a processing operation, etc.

In some examples, responsive to the output indicating a predicted substrate processing tool utilization being below a threshold value on a given day, the corrective action includes scheduling preventative maintenance for that given day of low predicted substrate processing tool utilization.

In some embodiments, at block 548, processing logic causes scheduling, routing, dispatching, and/or planning based on the one or more outputs. In some examples, processing logic performs scheduling associated with substrate lots (e.g., causes a corrective action of updating a schedule for substrate lots or generating a schedule for substrate lots) based on the one or more outputs. In some examples, processing logic performs dispatching of substrate lots (e.g., causes a corrective action of updating dispatching of substrate lots or determining dispatching for substrate lots) based on the one or more outputs. In some examples, processing logic performs planning associated with substrate lots (e.g., causes a corrective action of updating planning associated with substrate lots or determining planning associated with substrate lots) based on the one or more outputs. The processing logic uses the one or more outputs of the trained machine learning model to improve decisions (e.g., of scheduling, dispatching, planning, etc.).

In some embodiments, at block 548, the corrective action refers to the trained machine learning model being used to improve the dispatching decision (e.g., the substrate processing facility performs better because of the improved dispatching decision). In some embodiments, performing a corrective action refers to moving the substrate processing facility from a baseline performance to a better performance. In some embodiments, performing a corrective action refers to moving the substrate processing facility from a poor performance to meet or exceed a baseline performance (e.g., to a better performance).

At block 550, the processing logic receives current performance data associated with the substrate processing facility.

At block 552, the processing logic causes the trained machine learning model to be further trained with data input including the current data and target output including the current performance data.

In some embodiments, one or more of blocks 540-552 are repeated until the one or more outputs (e.g., predictive data) indicates that no further corrective actions are to be performed.

In some embodiments, processing logic provides a machine learning platform (e.g., user interface, graphical user interface). The processing logic receives, via the machine learning platform, the current data and causes, via the machine learning platform, the performance of the corrective action. In some embodiments, the processing logic receives, via the machine learning platform, user input specifying types of features (e.g., feature definition) and/or the type of target output (e.g., model definition).

FIG. 6 is a block diagram illustrating a computer system 600, according to certain embodiments. In some embodiments, the computer system 600 is one or more of client device 120, predictive system 110, server machine 170, server machine 180, or predictive server 112.

In some embodiments, computer system 600 is connected (e.g., via a network, such as a Local Area Network (LAN), an intranet, an extranet, or the Internet) to other computer systems. In some embodiments, computer system 600 operates in the capacity of a server or a client computer in a client-server environment, or as a peer computer in a peer-to-peer or distributed network environment. In some embodiments, computer system 600 is provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 600 includes a processing device 602, a volatile memory 604 (e.g., Random Access Memory (RAM)), a non-volatile memory 606 (e.g., Read-Only Memory (ROM) or Electrically-Erasable Programmable ROM (EEPROM)), and a data storage device 616, which communicate with each other via a bus 608.

In some embodiments, processing device 602 is provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

In some embodiments, computer system 600 further includes a network interface device 622 (e.g., coupled to network 674). In some embodiments, computer system 600 also includes a video display unit 610 (e.g., an LCD), an alphanumeric input device 612 (e.g., a keyboard), a cursor control device 614 (e.g., a mouse), and a signal generation device 620.

In some implementations, data storage device 616 includes a non-transitory computer-readable storage medium 624 on which store instructions 626 encoding any one or more of the methods or functions described herein, including instructions encoding components of FIG. 1 (e.g., corrective action component 122, predictive component 114, etc.) and for implementing methods described herein (e.g., one or more of methods 500A-C).

In some embodiments, instructions 626 also reside, completely or partially, within volatile memory 604 and/or within processing device 602 during execution thereof by computer system 600, hence, in some embodiments, volatile memory 604 and processing device 602 also constitute machine-readable storage media.

While computer-readable storage medium 624 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "identifying," "generating," "training," "storing," "receiving," "determining," "causing," "providing," "obtaining," "updating," "re-training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. In some embodiments, the terms "first," "second," "third," "fourth," etc. as used herein are meant as labels to distinguish among different elements and do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. Such a computer program is stored in a computer-readable tangible storage medium.

The methods and illustrative examples described herein are not inherently related to any particular computer or other apparatus. In some embodiments, various general purpose systems are used in accordance with the teachings described herein. In some embodiments, a more specialized apparatus is constructed to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method of operating a substrate processing facility, the method comprising:
    identifying historical data associated with historical substrate lots associated with historical sets of substrates processed by substrate processing tools in the substrate processing facility, wherein each historical substrate lot is a corresponding set of historical substrates;
    generating, based on perturbations of facility data, simulated data for simulated substrate lots associated with simulated sets of substrates processed by simulated substrate processing tools, wherein each simulated substrate lot is a simulation of a corresponding set of substrates, and wherein the perturbations comprise one or more of moving forward or backward lots in route;
    generating features from the historical data for the historical substrate lots and the simulated data for the simulated substrate lots;
    training a machine learning model with data input comprising the features to generate a trained machine learning model, wherein the trained machine learning model is trained to generate corresponding output indicative of one or more corresponding corrective actions to be performed in the substrate processing facility;

providing, as input to the machine learning model, current features of the substrate processing facility, wherein the current features are associated with a first substrate yield; and
    causing, based on output obtained from the trained machine learning model, performance of one or more current corrective actions associated with processing of corresponding sets of current substrates of current substrate lots in the substrate processing facility to produce a second substrate yield that is higher than the first substrate yield.

2. The method of claim 1, wherein the one or more current corrective actions comprise one or more of substrate lot scheduling, substrate lot dispatching, or substrate lot planning.

3. The method of claim 1, the corresponding set of historical substrates being processed on a same substrate processing tool with a same process.

4. The method of claim 1 further comprising storing the features in a data store to be reused for training additional machine learning models without regenerating the features.

5. The method of claim 1 further comprising receiving user input specifying one or more types of features, wherein the generating of the features is based on the user input.

6. The method of claim 1 further comprising:
    receiving user input specifying a first type of target output; and
    generating target output based on the first type of target output and the at least one of the historical data or the simulated data, wherein the training of the machine learning model is further based on the target output.

7. The method of claim 1 further comprising:
    identifying predetermined types of features, wherein the generating of the features is based on the predetermined types of features; and
    receiving user selection of the machine learning model from a plurality of predetermined machine learning models associated with predetermined types of target output.

8. A method of operating a substrate processing facility, the method comprising:
    identifying current data associated with current substrate lots of the substrate processing facility;
    identifying current features associated with the current data;
    providing the current features to a trained machine learning model that was trained based on historical features, wherein the current features are associated with a first substrate yield, the historical features being generated based on historical data for historical substrate lots associated with historical sets of substrates processed by substrate processing tools in the substrate processing facility and simulated data for simulated substrate lots associated with simulated sets of substrates processed by simulated substrate processing tools, wherein each historical substrate lot is a corresponding set of historical substrates, wherein each simulated substrate lot is a simulation of a corresponding set of substrates, the simulated data being generated based on perturbations of facility data, and wherein the perturbations comprise moving forward or backward lots in route, wherein the trained machine learning model is trained to generate corresponding output indicative of one or more corresponding corrective actions to be performed in the substrate processing facility;
    obtaining, from the trained machine learning model, an output; and causing, based on the output of the trained machine learning model, performance of one or more corrective actions associated with processing of corresponding sets of current substrates of the current substrate lots in the substrate processing facility to produce a second substrate yield that is higher than the first substrate yield.

9. The method of claim 8, wherein the one or more corrective actions comprise one or more of substrate lot scheduling, substrate lot dispatching, or substrate lot planning.

10. The method of claim 8, the corresponding set of historical substrates being processed on a same substrate processing tool with a same process.

11. The method of claim 8 further comprising retrieving the current features from a data store without regenerating the current features.

12. The method of claim 8 further comprising receiving user input specifying one or more types of features and generating one or more of the current features based on the user input.

13. The method of claim 8 further comprising receiving user input specifying a first type of target output, wherein the trained machine learning model is trained based on the first type of target output and the at least one of the historical data or the simulated data.

14. The method of claim 8 further comprising:

identifying predetermined types of features, wherein the identifying of the current features is based on the predetermined types of features; and receiving user selection of the trained machine learning model from a plurality of predetermined trained machine learning models associated with predetermined types of target output.

15. A non-transitory machine-readable storage medium storing instructions which, when executed cause a processing device to perform operations comprising:

identifying historical data associated with historical substrate lots associated with historical sets of substrates processed by substrate processing tools in a substrate processing facility, wherein each historical substrate lot is a corresponding set of historical substrates;

generating, based on perturbations of facility data, simulated data for simulated substrate lots associated with simulated sets of substrates processed by simulated substrate processing tools, wherein each simulated substrate lot is a simulation of a corresponding set of substrates, wherein the perturbations comprise moving forward or backward lots in route;

generating features from the historical data for the historical substrate lots and the simulated data for the simulated substrate lots;

training a machine learning model with data input comprising the features to generate a trained machine learning model, wherein the trained machine learning model is trained to generate corresponding output indicative of one or more corresponding corrective actions to be performed in the substrate processing facility;

providing, as input to the machine learning model, current features of the substrate processing facility, wherein the current features are associated with a first substrate yield; and causing, based on output obtained from the trained machine learning model, performance of one or more current corrective actions associated with processing of corresponding sets of current substrates of current substrate lots in the substrate processing facility to produce a second substrate yield that is higher than the first substrate yield.

16. The non-transitory machine-readable storage medium of claim 15, wherein the one or more current corrective actions comprise one or more of substrate lot scheduling, substrate lot dispatching, or substrate lot planning.

17. The non-transitory machine-readable storage medium of claim 15, the corresponding set of historical substrates being processed on a same substrate processing tool with a same process.

18. The non-transitory machine-readable storage medium of claim 15, wherein the operations further comprise storing the features in a data store to be reused for training additional machine learning models without regenerating the features.

19. The non-transitory machine-readable storage medium of claim 15, wherein the operations further comprise:

receiving user input specifying a first type of target output; and generating target output based on the first type of target output and the at least one of the historical data or the simulated data, wherein the training of the machine learning model is further based on the target output.

20. The non-transitory machine-readable storage medium of claim 15, wherein the operations further comprise:

identifying predetermined types of features, wherein the generating of the features is based on the predetermined types of features; and receiving user selection of the machine learning model from a plurality of predetermined machine learning models associated with predetermined types of target output.

* * * * *